US006956396B2

(12) United States Patent
Lai et al.

(10) Patent No.: US 6,956,396 B2
(45) Date of Patent: Oct. 18, 2005

(54) TESTING APPARATUS FOR FLAT-PANEL DISPLAY

(75) Inventors: Ming-Sheng Lai, Taipei (TW); Chung-Jen Cheng Chiang, Hualien County (TW); Kuei-Sheng Tseng, Taoyuan County (TW); Lee-Hsun Chang, Yunlin County (TW); Po-Jen Chiang, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/709,056

(22) Filed: Apr. 9, 2004

(65) Prior Publication Data

US 2005/0146349 A1 Jul. 7, 2005

(30) Foreign Application Priority Data

Jan. 2, 2004 (TW) .............................. 93100024 A

(51) Int. Cl.[7] ......................... G01R 31/00; G02F 1/136
(52) U.S. Cl. ........................... 324/770; 349/41; 349/54
(58) Field of Search .......................... 324/770; 349/40, 349/54

(56) References Cited

U.S. PATENT DOCUMENTS

| | | | | |
|---|---|---|---|---|
| 6,025,891 | A * | 2/2000 | Kim | 349/40 |
| 6,246,074 | B1 * | 6/2001 | Kim et al. | 257/48 |
| 6,590,624 | B1 * | 7/2003 | Lee | 349/54 |
| 2003/0117165 | A1 * | 6/2003 | Kim | 324/770 |
| 2003/0122975 | A1 * | 7/2003 | Kim et al. | 349/40 |

* cited by examiner

*Primary Examiner*—Vinh Nguyen
*Assistant Examiner*—Emily Y Chan
(74) *Attorney, Agent, or Firm*—Jiang Chyun IP Office

(57) ABSTRACT

A testing apparatus for flat-panel display is disclosed. The flat-panel display at least comprises a plurality of electrode lines and a plurality of driving circuits. The driving circuits are used to drive the electrode lines. The driving circuits and the testing apparatus are disposed on the opposite sides of the flat-panel display. The testing apparatus comprises a plurality of switching components and at least one shorting bar. The shorting bar electrically couples to the electrode lines through the switching components. When the switching components are thin film transistor, the switching components further comprise at least one switching line. The switching line electrically couples to the gates of the thin film transistors. The electrode lines are divided into several groups to electrically couple to the shorting bar and the switching line, for example.

9 Claims, 5 Drawing Sheets

TESTING APPARATUS FOR FLAT-PANEL DISPLAY

CROSS REFERENCE TO RELATED APPLICATIONS

This application claims the priority benefit of Taiwan application serial no. 93100024, filed Jan. 2, 2004.

BACKGROUND OF INVENTION

1. Field of the Invention

The present invention relates to a testing apparatus for a flat-panel display, and more particularly, to a flat-panel display testing apparatus in which the electrode lines are tested in groups and the lines electrically coupling the electrode lines and the testing apparatus need not be cut off after the testing is completed.

2. Description of Related Art

The Information Technology (IT) industry is a mainstream industry in modern life. Especially, the display product for various portable communication devices has become an important development subject in this field. Presently flat panel is popularly used because of its advantageous features of high picture quality, small space utilization, low power consumption and radiation free. Therefore, the flat-panel display, which works as a communication interface between users and information, has accordingly become a very important tool in our every day activities. The flat-panel display is classified in the following categories: the Organic Electro-Luminescent Display, OELD), the Plasma Display Panel (PDP), the Liquid Crystal Display (LCD), the Light Emitting Diode (LED), the Vacuum Fluorescent Display, the Field Emission Display (FED), and the Electro-chromic Display. After the flat-panel display is manufactured, it must be tested to ensure of its proper operation before it is shipped to the customer.

An apparatus and a method of testing a Thin Film Transistor Liquid Crystal Display (TFT LCD) are described as follows. FIG. 1 is a circuit diagram of a apparatus for testing a conventional TFT LCD. As shown in FIG. 1, the TFT LCD 100 is defined into a display area 110 and a peripheral area 120. Wherein, a plurality of electrode lines 130 is disposed on the display area 110, and a plurality of driving circuits 140 is disposed on the peripheral area 120 for driving the electrode lines 130. For testing the TFT LCD, a shorting bar 150 is electrically coupled to the electrode lines 130 and then a signal is fed into the electrode lines 130 via the shorting bar 150. to check for its proper operation.

After completing the above test, the lines used for an electrically coupling the shorting bar 150 and electrode lines 130 of the TFT LCD 100 are cut to disconnect or separate the shorting bar 150 from the TFT LCD 100. However, the step of cutting the lines electrically coupling the shorting bar 150 and the electrode lines inevitably consumes time and thereby increasing the manufacturing cost.

FIG. 2 is a circuit diagram of a testing apparatus for testing a conventional TFT LCD. As shown in FIG. 2, a shorting bar 152 is disposed in a peripheral area 122 of the TFT LCD 102 and is electrically coupled to the electrode lines 132. The TFT LCD 102 is tested by feeding a signal into the electrode lines 132 via the shorting bar 152. After the testing of the TFT LCD 102 is completed, a laser beam is used for cutting the lines electrically coupling the shorting bar 152 and the electrode lines of the TFT LCD 102. However, the shorting bar 152 still remains within the TFT LCD 102 in this case.

Although the aforementioned laser cutting step is rather simple, but since the shorting bar 152 and the driving circuits 142 are disposed in the peripheral area 122, and therefore the size of the TFT LCD 102 is hard to reduce.

SUMMARY OF INVENTION

Accordingly, the present invention is directed to a testing apparatus of a flat-panel display. The testing apparatus is capable of testing the electrode lines of the flat-panel display in groups, and the lines electrically coupling the electrode lines and the testing apparatus need not be cut after the testing is completed. Further, such that the size of the testing apparatus is smaller compared to the conventional testing apparatus allowing further reduction the size of the flat-panel display.

According to an embodiment of the present invention, the flat-panel display to be tested at least comprises a plurality of electrode lines and a plurality of driving circuits. Wherein, the driving circuits are used for driving the electrode lines and are disposed on a first side of the flat-panel display.

The testing apparatus comprises a plurality of switching components and at least a shorting bar. The switching components are electrically coupled to the electrode lines and are disposed on a second side of the flat-panel display. The shorting bar is electrically coupled to the switching components. In addition, the first side is positioned opposite to the second side. In other words, the shorting bar and the driving circuits are respectively disposed on two opposite sides of the display area of the flat-panel display.

In an embodiment of the present invention, each of the switching components comprises one or more diodes, or comprises one or more TFT. The electrode lines are for example the data lines or the scan lines.

In an embodiment of the present invention, the flat-panel display comprises at least a plurality of electrode lines and a plurality of driving circuits. The driving circuits are adapted for driving the electrode lines.

In an embodiment of the present invention, the testing apparatus comprises a plurality of switching components, a switching set, and a plurality of shorting bars. Each of the switching components comprises a gate, a first source/drain, and a second source/drain. The first source/drain is electrically coupled to the electrode lines. The switching set is electrically coupled to the gates of the switching components. In addition, each of the shorting bars is electrically coupled to the second sources/drains of some of the switching components.

In an embodiment, when the switching set comprises a plurality of switching lines, each of the switching lines are electrically coupled to the gates of some switching components. Moreover, each of the switching components is, for example, comprised of one or more TFT, and the electrode lines are, for example, the data lines or the scan lines.

In another embodiment of the present invention, the testing apparatus comprises a plurality of switching components, a plurality of switching lines and a shorting bar. Each of the switching components comprises a gate, a first source/drain, and a second source/drain. The first source/drain is electrically coupled to the electrode lines. The switching lines are electrically coupled to the gates of the switching components, and each of the switching lines is electrically coupled to the gates of some of switching components. In addition, the shorting bar is electrically coupled to the second sources/drains of the switching components.

In addition, each of the switching components is, for example, comprised of one or more TFT, and the electrode lines are, for example, the data lines or the scan lines.

In another embodiment of the present invention, the testing apparatus comprises a plurality of switching components and a shorting bar set. The switching components are electrically coupled to the electrode lines, and the shorting bar set is electrically coupled to the switching components.

In an embodiment, when the shorting bar set comprises a plurality of shorting bars, each of the shorting bars is electrically coupled to some of the switching components. Moreover, each of the switching components is, for example, comprised of a diode, and the electrode lines are, for example, the data lines or the scan lines.

In summary, in the testing apparatus for the flat-panel display according to an embodiment of the present invention, the shorting bar and the driving circuits are disposed on the opposite sides of the display area of the flat-panel display, respectively, thus this allows further reduction in the size of the flat-panel display. In addition, since the switching components are in a high impedance state (almost as an open circuit state) in the normal operation, the step of cutting the lines electrically coupling the shorting bar and the electrode lines after the testing is completed can be eliminated. Moreover, the electrode lines of the flat-panel display can be tested in groups.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

First Embodiment

Figure 1:
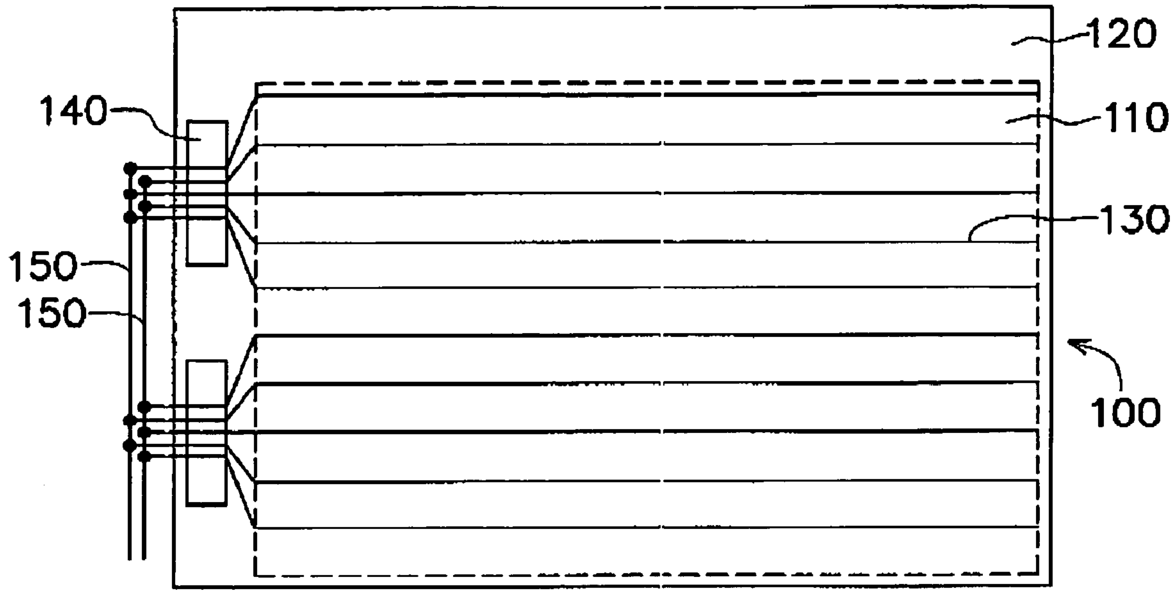
FIG. 1 (PRIOR ART)
FIG. 1 is a circuit diagram of a conventional testing apparatus for a conventional TFT LCD.
Figure 2:
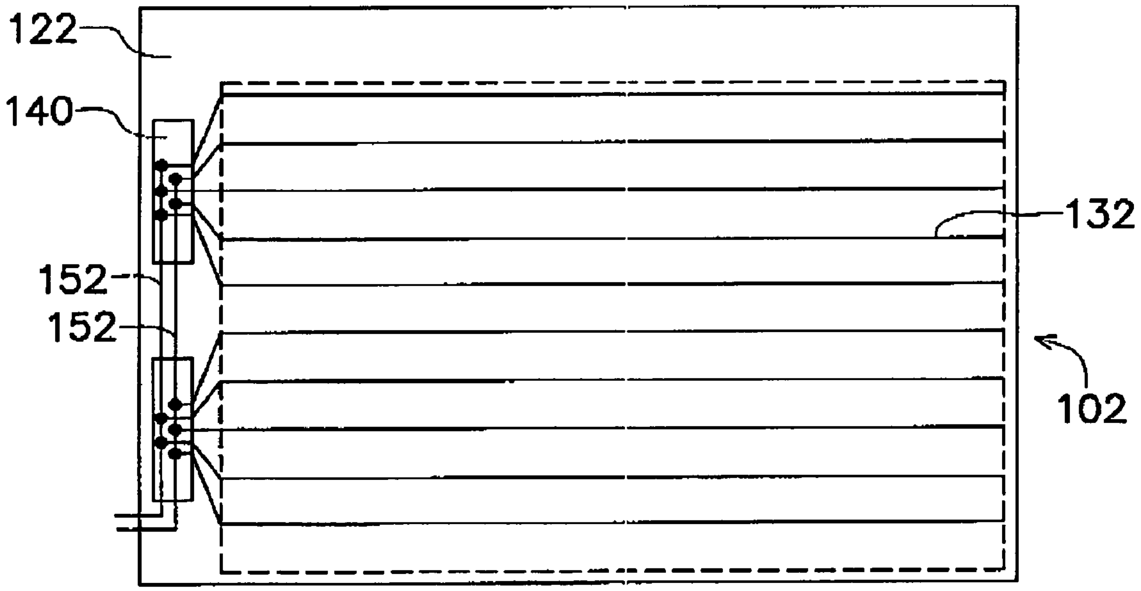
FIG. 2 (PRIOR ART)
FIG. 2 is a circuit diagram of another conventional testing apparatus for a conventional TFT LCD.
Figure 3A:
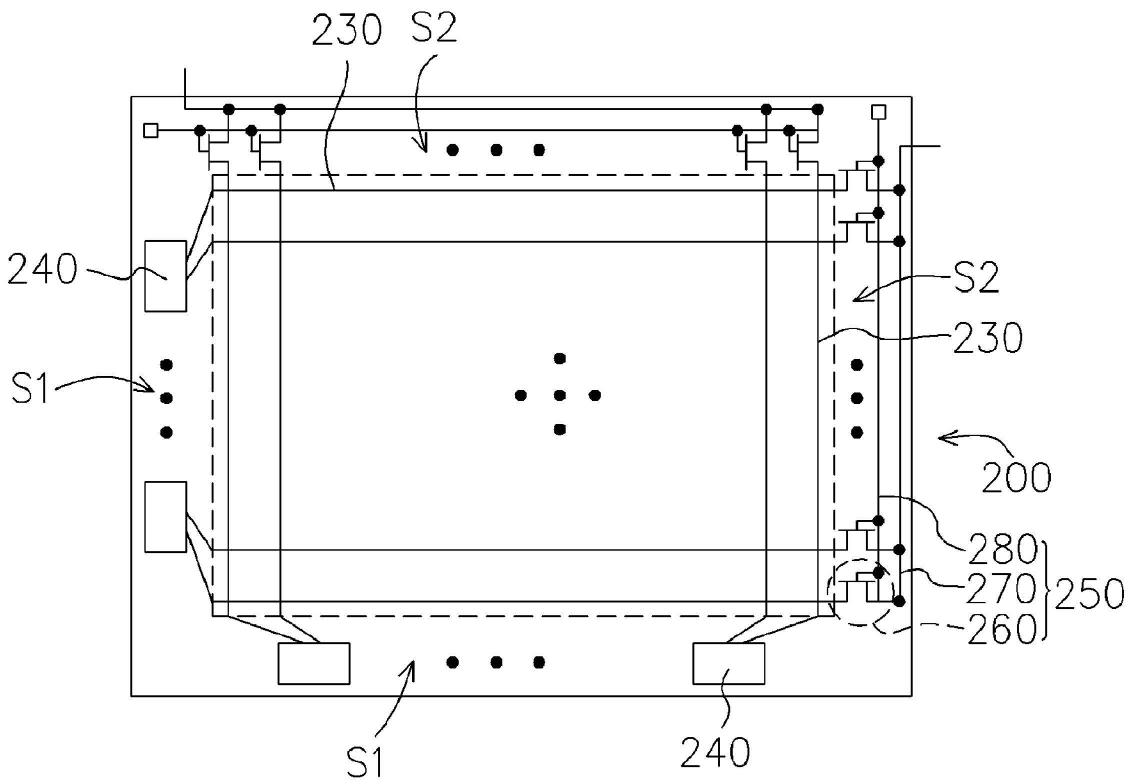
FIGS. 3A and 3B are the circuit diagrams of a testing apparatus for a flat-panel display according to a first embodiment of the present invention.
Figure 3B:
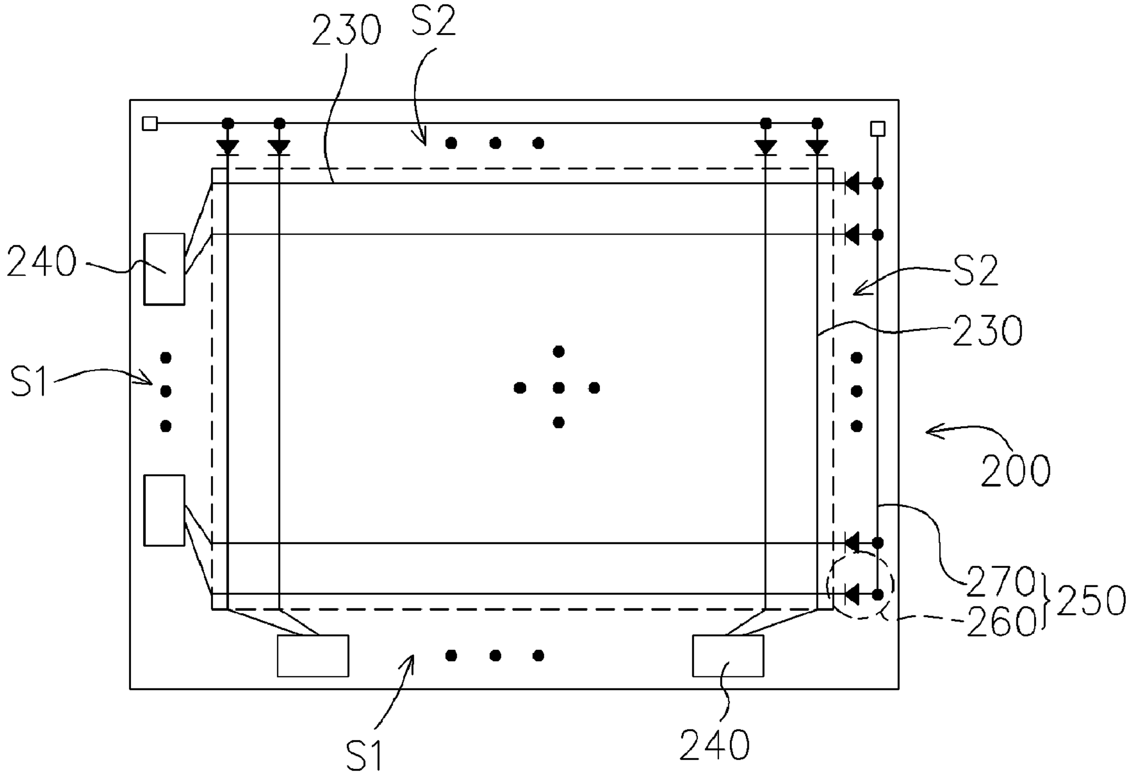

FIGS. 3A and 3B are the circuit diagrams of a testing apparatus for a flat-panel display according to a first embodiment of the present invention. As shown in FIGS. 3A and 3B, the flat-panel display 200 comprises at least a plurality of electrode lines 230 and a plurality of driving circuits 240. The driving circuits 240 are adapted for driving the electrode lines 230, and are disposed on a first side S1 of the flat-panel display 200.

The testing apparatus 250 comprises a plurality of switching components 260 and at least one shorting bar 270. The switching components 260 are electrically coupled to the electrode lines 230, and are disposed on a second side S2 of the flat-panel display 200. The shorting bar 270 is electrically coupled to the switching components 260. In addition, the first side S1 is positioned opposite to the second side S2, that is the shorting bar 270 and the driving circuits 240 are disposed on the opposite sides of the flat-panel display 200, respectively.

Figure 4:
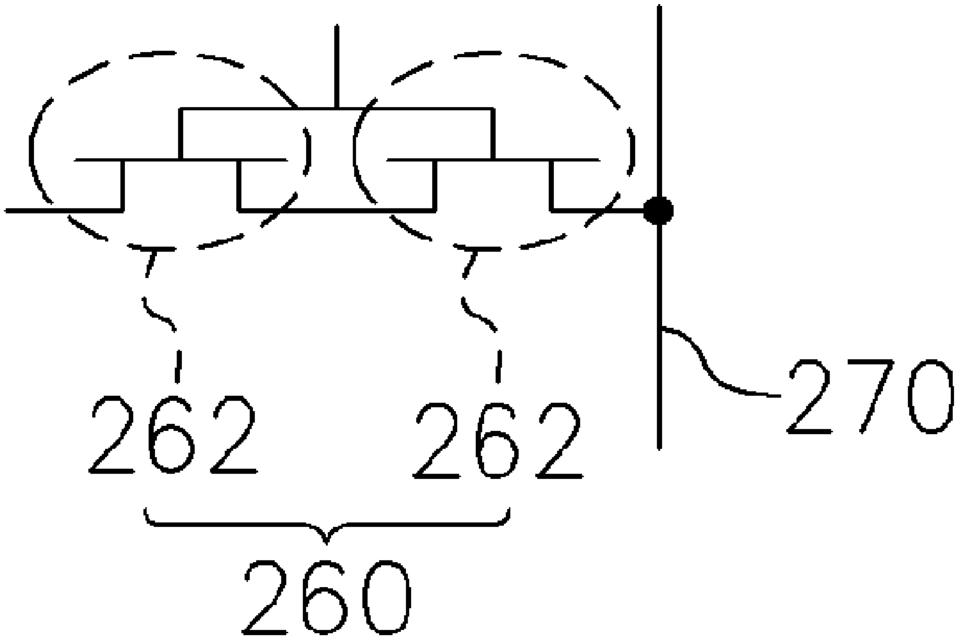
FIG. 4 is a circuit diagram of switching components composed of the TFT according to an embodiment of the present invention.

In the present embodiment shown in FIG. 3A, each of the switching components 260 is, for example, composed of a TFT. The testing apparatus 250 further comprises at least one switching line 280, which is electrically coupled to the switching components 260. FIG. 4 is a circuit diagram of switching components composed of the TFT according to an embodiment of the present invention. As shown in FIG. 4, in order to reduce the current leakage of the switching components 260, the component switching 260 is not necessarily limited to be composed of only one TFT 262, instead the switching components 260 may also be composed a plurality of TFT 262.

In an embodiment shown in FIG. 3B, the switching components 260 are, for example, composed of diodes.

Since the shorting bar 270 is disposed on the opposite side of the driving circuit 240, and therefore the width of the first side S1 of the flat-panel display 200 is reduced so that this design allows further size reduction of the flat-panel display 200. In addition, since the shorting bar 270 is electrically coupled to the electrode lines 230 via the switching components 260, the switching components 260 can be turned on only by applying a voltage to a switching line 280 (as shown in FIG. 3A) or applying a current to the shorting bar 270 (as shown in FIG. 3B). It should be noted that when a current is applied to the electrode lines 230, the switching components 260 are not turned on. Therefore, after the testing of the flat-panel display 200 by the testing apparatus 250 is completed, even when the lines electrically coupling the testing apparatus 250 and the electrode lines 230 were not cut, the electrode lines 230 are not electrically coupled with each other via the testing apparatus 250.

Referring to FIGS. 3A and 3B, the electrode lines 230 are, for example, the data lines or the scan lines. The data lines are, for example, the electrode lines 230 which are vertically disposed, and the scan lines are the electrode lines 230 which are horizontally disposed. Therefore, the shorting bar 270 and the switching components 260 which are electrically coupled to the electrode lines 230 can be used to test the data lines and the scan lines of the flat-panel display 200 to check whether is the flat-panel display 200 properly.

Second Embodiment

Figure 5A:
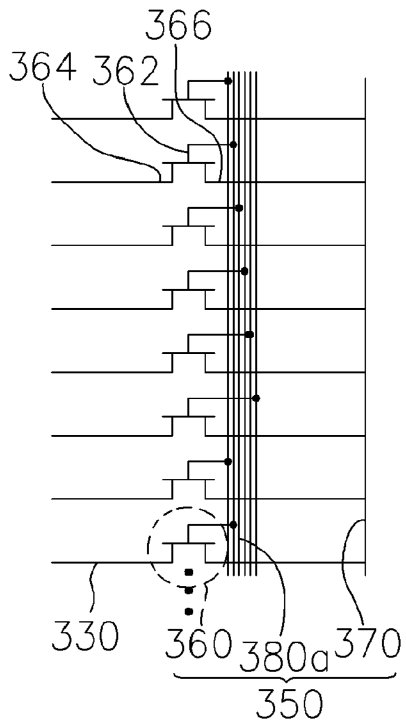
FIG. 5A~5C are the circuit diagrams of a testing apparatus for a flat-panel display according to a second embodiment of the present invention.
Figure 5B:
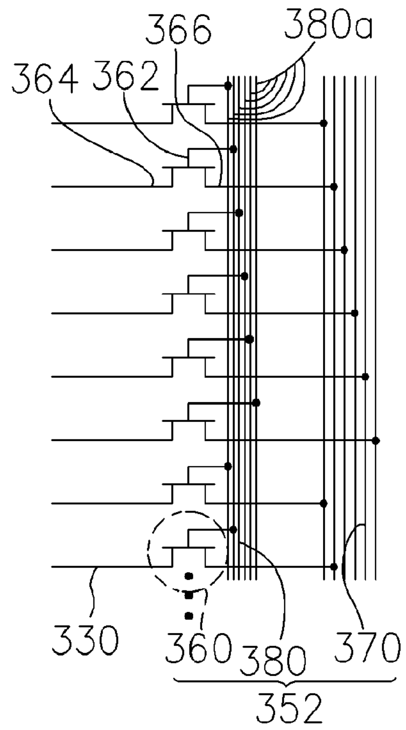
Figure 5C:
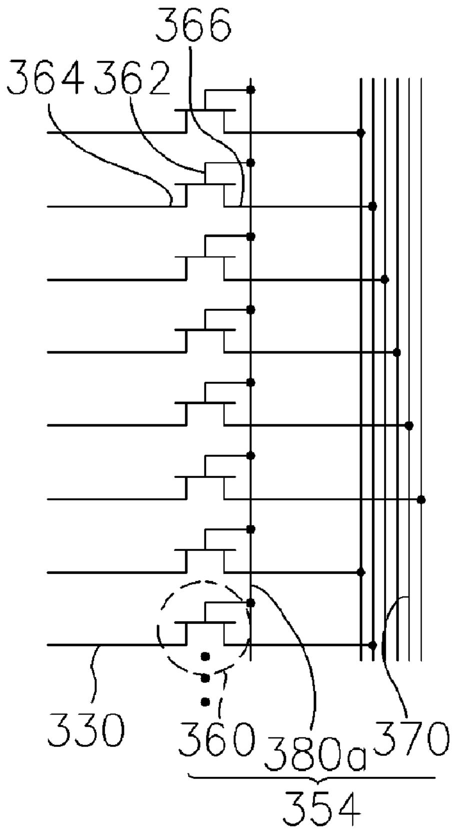

FIG. 5A~5C are the circuit diagrams of the testing apparatus for the flat-panel display according to a second preferred embodiment of the present invention. The structure of the flat-panel display according to the second preferred embodiment is the same as that of the first preferred embodiment, and therefore detailed description thereof is not repeated hereinafter. However, the testing apparatus according to the second preferred embodiment of the present invention is not necessarily limited to be disposed on the opposite side of the driving circuit 240 as shown in FIG. 3A, it can be disposed on the same side of the driving circuit 240.

Referring to FIG. 5A, the testing apparatus 350 comprises a plurality of switching components 360, a plurality of switching lines 380*a*, and a shorting bar 370. Each of the switching components 360 comprises a gate 362, a first source/drain 364, and a second source/drain 366, respectively. The first source/drain 364 is electrically coupled to the electrode lines 330. Each of the switching lines 380*a* is electrically coupled to the gates 362 of some of the switching components 360, respectively. The shorting bar 370 is electrically coupled to the second sources/drains 366 of all switching components 360. The switching components 360 are, for example, composed of one or more TFT.

As described above, by selectively turning on the switching lines 380*a*, the electrode lines 330 can be tested in groups. For example, the grouping of the electrode lines 330 can be based on the electrode lines 330 in a pixel area corresponding a unique color so that a pixel area of the same color can be tested at a time. In addition, the electrode lines 330 may be grouped based on other considerations.

Referring to FIG. 5B, the testing apparatus 352 comprises a plurality of switching components 360, a switching set 380, and a plurality of shorting bars 370. Each of the switching components 360 comprises a gate 362, a first source/drain 364, and a second source/drain 366, respectively. The first source/drain 364 is electrically coupled to the electrode lines 330. The switching set 380 comprises a plurality of switching lines 380*a*, and each of the switching lines 380*a* is electrically coupled to the gates 362 of some of the switching components 360, respectively. Each of the shorting bars 370 is electrically coupled to the second sources/drains 366 of some of the switching components 360, respectively. In addition, the switching components 360 are, for example, composed of one or more TFT. Following the description above, by selectively turning on the switching lines 380*a* and the shorting bars 370, the electrode lines 330 can be tested in groups.

Referring to FIG. 5C, the testing apparatus 354 comprises a plurality of switching components 360, a switching line 380*a*, and a plurality of shorting bars 370. Each of the switching components 360 comprises a gate 362, a first source/drain 364, and a second source/drain 366, respectively. The first source/drain 364 is electrically coupled to the electrode lines 330. The switching line 380*a* is electrically coupled to the gates 362 of all switching components 360. Each of the shorting bars 370 is electrically coupled to the second sources/drains 366 of some of the switching components 360. In addition, the switching components 360 are, for example. comprised of one or more TFT. Similarly, by selectively turning on the shorting bars 370, the electrode lines 330 can be tested in groups.

Third Embodiment

Figure 6:
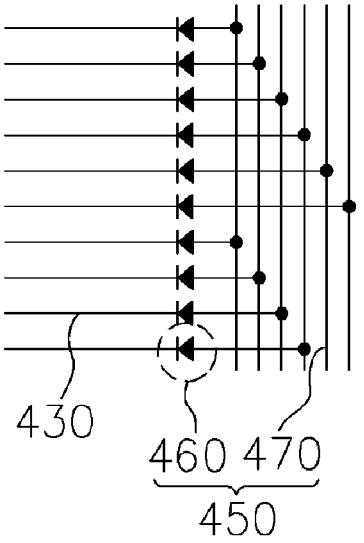
FIG. 6 is a circuit diagram of a testing apparatus for a flat-panel display according to a third embodiment of the present invention.

FIG. 6 is a circuit diagram of a testing apparatus for the flat-panel display according to a third embodiment of the present invention. The structure of the flat-panel display of the third preferred embodiment of the present invention is same as that of the first preferred embodiment, and therefore detailed description thereof is not repeated hereinafter. However, the testing apparatus according to the third embodiment of the present invention is not necessarily limited to be disposed on the opposite side of the driving circuit 240 as shown in FIG. 3B, it can be disposed on the same side of the driving circuit 240.

Referring to FIG. 6, the testing apparatus 450 comprises a plurality of switching components 460 and a shorting bar set 470. The shorting bar set 470 are, for example, composed of a plurality of shorting bars 470*a*, and each of the shorting bars 470*a* is electrically coupled to some of the switching components 460, respectively. In addition, the switching components 460 are, for example, composed of one or more diodes. By selectively turning on the shorting bars 470*a*, the electrode lines 430 can be tested in groups. For example, the grouping of the electrode lines 430 can be based on the electrode lines 430 of a pixel area corresponding to a unique color so that a pixel area of the same color can be tested at a time. In addition, the electrode lines 430 may be grouped based on other considerations.

In summary, in the testing apparatus for the flat-panel display according to an embodiment of the present invention, the shorting bar and driving circuits are disposed on the opposite sides of the driving circuit 240 of the flat-panel display, and therefore this design allows further size reduction of the flat-panel display. In addition, since the shorting bar is electrically coupled to the electrode lines via the switching components, even when the lines electrically coupling the shorting bar and the electrode lines are not cut after the testing is completed, the electrode lines are not electrically coupled to each other since the switching components are turned off. Furthermore, by arranging the shorting bars and the switching lines in different manner, the electrode lines of the flat-panel display can be tested in groups.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A testing apparatus, for a flat-panel display comprising at least a plurality of electrode lines and a plurality of driving circuits for driving the electrode lines, the testing apparatus comprising:

- a plurality of switching components, each of the switching components comprising a gate, a first source/drain, and a second source/drain, respectively, wherein the first sources/drains are electrically couple to the electrode lines;
- a switching set electrically coupled to the gates of the switching components; and
- a plurality of shorting bars, each of the shorting bars electrically coupled to the second sources/drains of some of the switching components.

2. The testing apparatus for the flat-panel display of claim 1, wherein when the switching set comprises a plurality of switching Lines, each of the switching lines are electrically coupled to the gates of some of the switching components.

3. The testing apparatus for the flat-panel display of claim 1, wherein each of the switching components comprises at least one TFT.

4. The testing apparatus for the flat-panel display of claim 1, wherein the electrode lines comprise a plurality of data lines.

5. The testing apparatus for the flat-panel display of claim 1, wherein the electrode lines comprise a plurality of scan lines.

6. A testing apparatus, for a flat-panel display comprising at least a plurality of electrode lines and a plurality of driving circuits for driving the electrode lines, and the testing apparatus comprising:

- a plurality of switching components, each of the switching components comprising a gate, a first source/drain, and a second source/drain, respectively, and the first sources/drains being electrically coupled to the electrode lines;
- a plurality of switching lines, electrically coupled to the gates of the switching components, and each of the switching lines electrically coupled to the gates of some of the switching components; and a shorting bar, electrically coupled to the second sources/drains of the switching components.

7. The testing apparatus for the flat-panel display of claim 6, wherein each of the switching components comprises at least one TFT.

8. The testing apparatus for the flat-panel display of claim 6, wherein the electrode lines comprise a plurality of data lines.

9. The testing apparatus for the flat-panel display of claim 6, wherein the electrode lines comprise a plurality of scan lines.

* * * * *